United States Patent
Gupta et al.

(10) Patent No.: US 8,487,805 B1
(45) Date of Patent: Jul. 16, 2013

(54) SUCCESSIVE APPROXIMATION ANALOG-TO-DIGITAL CONVERTER

(75) Inventors: Sunny Gupta, Noida (IN); Kumar Abhishek, Ghaziabad (IN); Kushal Kamal, Noida (IN); Samaksh Sinha, Singapore (SG)

(73) Assignee: Freescale Semiconductor, Inc., Austin, TX (US)

( * ) Notice: Subject to any disclaimer, the term of this patent is extended or adjusted under 35 U.S.C. 154(b) by 23 days.

(21) Appl. No.: 13/403,945

(22) Filed: Feb. 23, 2012

(51) Int. Cl.
*H03M 1/34* (2006.01)

(52) U.S. Cl.
USPC ............................. 341/163; 341/155

(58) Field of Classification Search
USPC ............... 341/144, 155, 163, 164, 165
See application file for complete search history.

(56) References Cited

U.S. PATENT DOCUMENTS

| | | | |
|---|---|---|---|
| 4,983,974 A | 1/1991 | Mijuskovic | |
| 6,535,157 B1 | 3/2003 | Garrity | |
| 7,504,977 B2 | 3/2009 | Doorenbos | |
| 7,733,258 B2 | 6/2010 | Berens | |
| 7,796,079 B2 | 9/2010 | Khanna | |
| 7,839,319 B2 | 11/2010 | Nittala | |
| 7,969,167 B2 | 6/2011 | Khanna | |
| 8,185,774 B2 * | 5/2012 | Diewald et al. | 713/502 |
| 8,274,418 B2 * | 9/2012 | Koli | 341/155 |
| 8,301,803 B2 * | 10/2012 | Wegener | 709/247 |
| 2009/0073018 A1 | 3/2009 | Mitikiri | |

OTHER PUBLICATIONS

Dragan B. Stankovic, Mile K. Stojcev, Goran Li Djordjevic, Power Reduction Technique for Successive-Approximation Analog-to-Digital Converters, 8th International Conference on Telecommunications in Modern Satellite, Cable and Broadcasting Services, 2007. TELSIKS 2007., Sep. 26-28, 2007, pp. 355-358, IEEE, Serbia.
Neubauer; "A Successive Approximation A/D Converter with 16bit 200kS/s in 0.6pm CMOS using Self-Calibration and Low Power Techniques"; IEEE; 2001.

* cited by examiner

*Primary Examiner* — Peguy Jean Pierre
(74) *Attorney, Agent, or Firm* — Charles Bergere

(57) ABSTRACT

An analog-to-digital converter (ADC) converts an analog input signal to a digital output signal by sampling an analog input signal to obtain an analog sample and then converting the analog sample to the digital output signal using a successive approximation algorithm. The method decreases ADC conversion time and increases ADC throughput.

14 Claims, 3 Drawing Sheets

SUCCESSIVE APPROXIMATION ANALOG-TO-DIGITAL CONVERTER

BACKGROUND OF THE INVENTION

The present invention relates generally to analog-to-digital conversion, and more particularly, to an adaptive, analog-to-digital conversion using successive approximation.

Analog-to-digital converters (ADCs) are widely used in modern electronic equipment for converting analog signals to digital signals. A successive approximation algorithm is commonly used for the analog-to-digital conversion. Each analog-to-digital conversion cycle includes a sampling cycle for sampling the analog input signal to obtain a sampled voltage. The sampling cycle is followed by a comparison cycle in which the sampled voltage is compared with a series of comparison voltages generated based on a digital code. Each successive comparison voltage in the series is generated by setting the next most significant bit (MSB) of the digital code to binary 1 and the preceding bit to the original state, i.e., binary 0, resulting in each successive comparison voltage either being half of the preceding comparison voltage or being a sum of or difference between half of the preceding comparison voltage and half of a successive voltage range. If the sampled voltage is greater than a comparison voltage, the corresponding bit of the digital signal is set to binary 1, else the bit is set to binary 0. The above process is repeated for each bit of the digital signal, progressing from the MSB to the least significant bit (LSB).

Each comparison cycle includes multiple sub-comparison cycles corresponding to multiple bits of the digital signal. Therefore, the higher the resolution of the ADC, the higher the number of sub-comparison cycles and the longer the analog-to-digital conversion time. Thus, throughput of the ADC is reduced and power consumption is increased.

Therefore, it would be advantageous to have an ADC that has a reduced analog-to-digital conversion time, increased throughput, and reduced power consumption.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
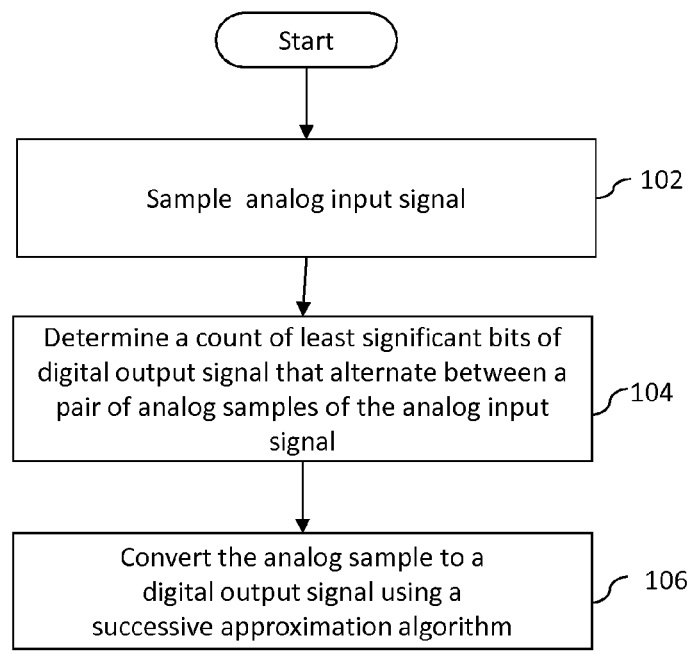
FIG. 1 is a flowchart depicting a method for converting an analog signal to a digital signal in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for converting an analog input signal to a digital output signal in one or more analog-to-digital conversion cycles is provided. The analog input signal is sampled to obtain a first analog sample in a sampling cycle. A count of least significant bits (LSB) of the digital output signal that alternate between the first analog sample and a second analog sample of the analog input signal is determined based on a frequency of the analog input signal and a predetermined bit-length of the digital output signal. The second analog sample is sampled in a previous sampling cycle. The first analog sample is converted to the digital output signal using a successive approximation algorithm. The successive approximation algorithm is executed for a count equal to the count of the LSBs that alternate between the first and second analog samples.

In another embodiment of the present invention, a method for converting an analog input signal to a digital output signal in one or more analog-to-digital conversion cycles is provided. The analog input signal is sampled to obtain a first analog sample in a sampling cycle. A count of LSBs of the digital output signal that alternate between the first analog sample and a second analog sample of the analog input signal is determined based on a frequency of the analog input signal and a predetermined bit-length of the digital output signal. The second analog sample is sampled in a previous sampling cycle. A comparison is performed between a magnitude of the first analog sample and a magnitude of a comparison voltage. The comparison voltage is modified based on the magnitude of the first analog sample, wherein modifying the comparison voltage includes either increasing or decreasing the magnitude of the comparison voltage by a predetermined value. The digital output signal corresponding to the first analog sample is generated by executing a successive approximation algorithm for a count equal to the count of the LSBs that alternate between the first and second analog samples.

In yet another embodiment of the present invention, a system for converting an analog input signal to a digital output signal in one or more analog-to-digital conversion cycles is provided. The system includes a sample-and-hold circuit that samples the analog input signal to obtain a first analog sample in a sampling cycle. A processor determines a count of LSBs of the digital output signal that alternate between the first analog sample and a second analog sample of the analog input signal based on a frequency of the analog input signal and a predetermined bit-length of the digital output signal. The second analog sample is sampled in a previous sampling cycle. An analog-to-digital converter (ADC) is connected to the sample-and-hold circuit and the processor and converts the first analog sample into the digital output signal using a successive approximation algorithm. The ADC executes the successive approximation algorithm for a count equal to the count of the LSBs that alternate between the first and second analog samples.

Various embodiments of the present invention provide a method and system for converting an analog input signal to a digital output signal. An analog input signal is sampled during a sampling cycle to obtain a first analog sample. A count of LSBs that alternate between the first analog sample and a second analog sample obtained in a previous sampling cycle is calculated based on a frequency of the analog input signal and a bit-length of the digital output signal. The first analog sample is converted to the digital output signal by executing a successive approximation algorithm for a count equal to the count of LSBs that alternate. Thus, the successive approximation algorithm is executed for generating LSBs that alternate between the first and second analog samples instead of being executed for all bits (equal to the bit-length) of the digital output signal. As a result, time and power required for converting the analog input signal to the digital output signal are reduced and the throughput of the ADC is increased.

Referring now to FIG. 1, a flowchart depicting a method for converting an analog input signal to a digital output signal in accordance with an embodiment of the present invention is shown.

At step 102, the analog input signal is sampled during a sampling cycle. The analog input signal is sampled using sample-and-hold (S/H) circuitry to obtain a first analog sample. A second analog sample is obtained from a previous sampling cycle. In an embodiment of the present invention, the first and second analog samples are obtained in consecutive sampling cycles, while in alternative embodiments, the samples may come from non-consecutive sampling cycles. At step 104, a count of least significant bits (LSBs) of the digital output signal that alternate between the first analog sample and a second analog sample is determined. The count of LSBs is determined based on a maximum frequency of the analog input signal and a bit-length of the digital output signal, i.e. the resolution of the ADC. In an embodiment of the present invention, a frequency band (bandwidth) of the analog signal is provided by a user and the bandwidth is chosen to be less than half of a sampling frequency. Theoretically, the mathematical relationship between the count of alternating LSBs, the maximum frequency, and the bit-length of the digital output signal is given by equation (1), $$\Delta LSB = N + 3.321 * \log_{10}[\sin(2 * \pi * T_{conv}/T_{max})] \quad (1)$$

where,

N=(Bit-length of the digital output signal)/(resolution of the ADC), $t_{conv}$=Analog-to-digital conversion time (in seconds) of the ADC, and $T_{max}$=1/(maximum frequency (bandwidth) of the analog input signal).

Equation (1) shows that the lower the maximum frequency of the analog input signal, the smaller the number of LSBs that alternate between a pair of analog samples (the first and second analog samples) obtained in consecutive sampling cycles.

At step 106, the first analog sample is converted to the digital output signal using a successive approximation algorithm. The successive approximation is executed for the LSBs that alternate between the first and the second analog samples (i.e., alternating bit values). For example, assume an analog input signal and an ADC have the following attributes:

ADC resolution=12,
$T_{conv}$=1.00E-06 s, and
$F_{max}$=1000 Hz.

According to equation (1), the count of LSBs that will alternate between the first and second analog samples is 5, which means 7 MSBs (ADC resolution–the count of LSBs that alternate, i.e., 12–5) remain fixed between the first and second analog samples. Thus, the successive approximation algorithm is executed 5 times, i.e., only for the LSBs that alternate, instead of 12 times, to obtain the digital output signal corresponding to the first analog sample.

Figure 2A:
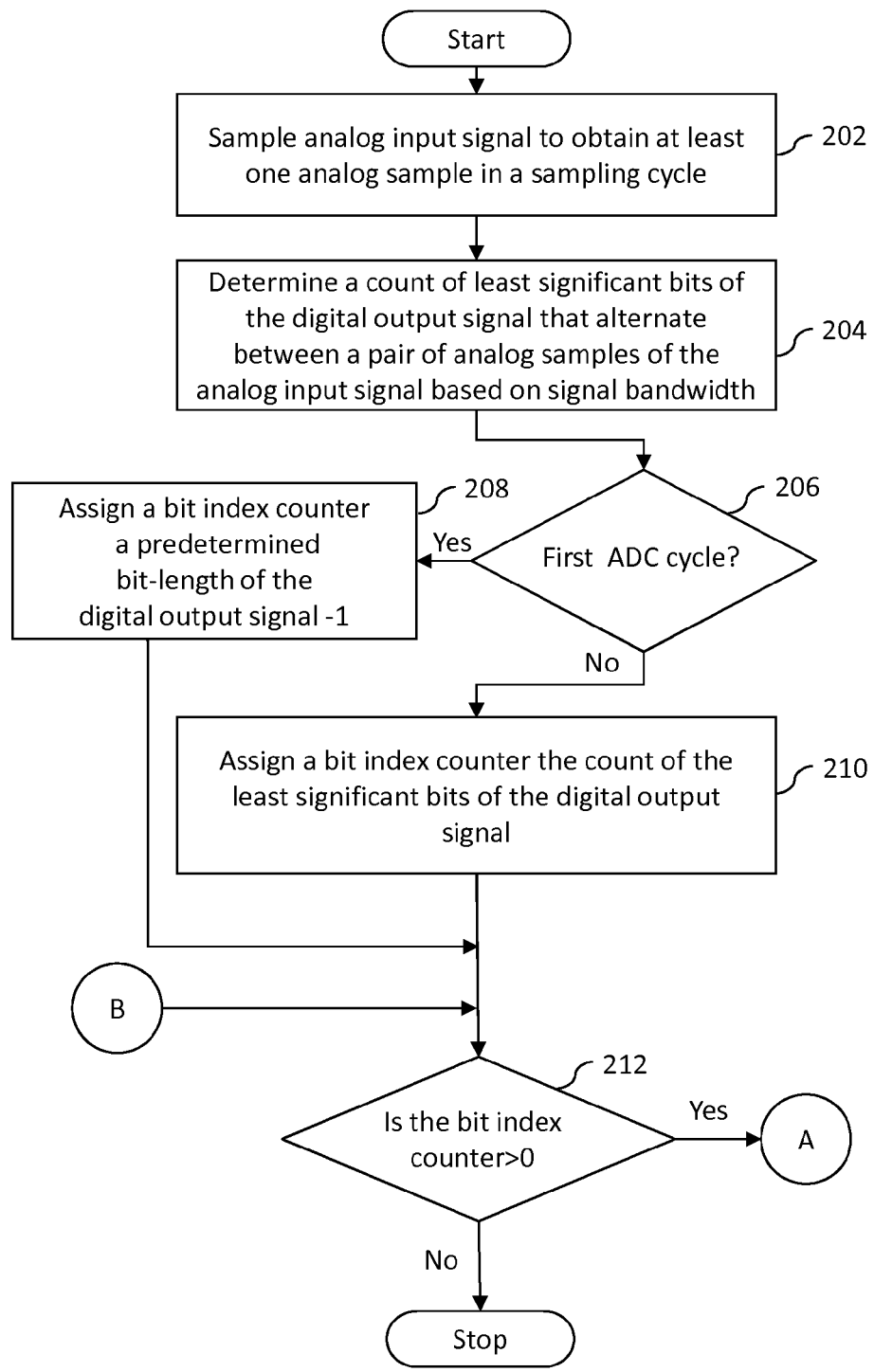
FIGS. 2A and 2B are flowcharts depicting a method for converting an analog signal to a digital signal in more detail, in accordance with an embodiment of the present invention.
Figure 2B:
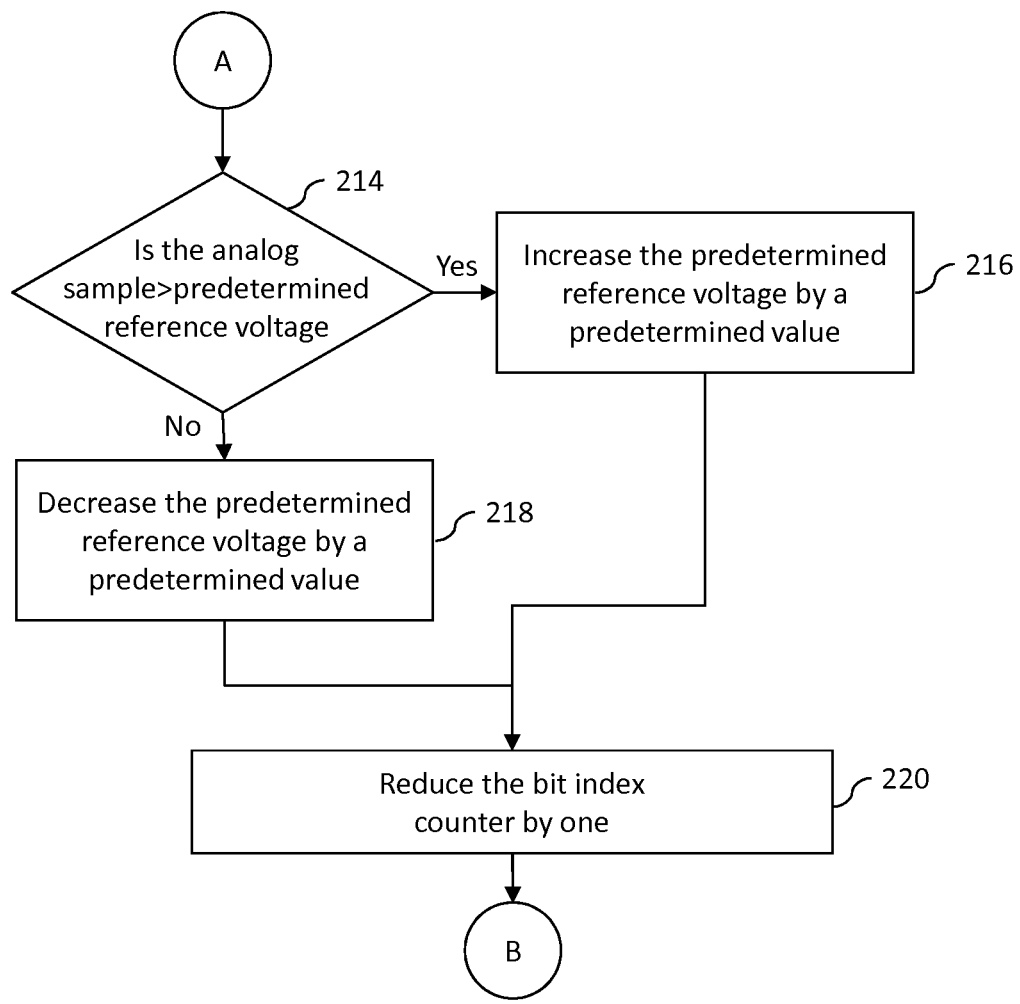

Referring now to FIGS. 2A and 2B, a more detailed flowchart depicting a method for converting an analog input signal to a digital output signal in accordance with another embodiment of the present invention is shown.

At step 202, a sampling cycle is initiated in which the analog input signal is sampled to obtain a first analog sample. A second analog sample is obtained during a previous (or later) sampling cycle. In an embodiment of the present invention, the first and second analog samples are obtained in consecutive sampling cycles. At step 204, a count of LSBs of the digital output signal that alternate between the first and second analog samples is determined. At step 206, a check is performed to determine whether an analog-to-digital conversion cycle initiated for the analog input signal is a first conversion cycle. If at step 206 it is determined that the analog-to-digital conversion cycle is the first conversion cycle, step 208 is executed. At step 208, a bit index counter is assigned a value that is less than a predetermined bit-length of the digital output signal by one (i.e., bit-length–1). For example, if the resolution of the ADC is 12, the bit index counter is assigned a value of 11. Additionally, a comparison voltage is assigned a value of a reference voltage/2, which is a standard step performed in the successive approximation algorithm. If at step 206, it is determined that the analog-to-digital conversion cycle is not the first conversion cycle, step 210 is executed. At step 210, a bit index counter is assigned a value that is less than the count of LSBs of the digital output signal that alternate by one (count of alternating LSBs–1). For example, if the count of LSBs that alternate is 5, the bit index counter is assigned a value of 4.

At step 212, a check is performed to determine whether the bit index counter is greater than 0. If it is determined that the bit index counter is greater than 0, step 214 is executed; otherwise the analog-to-digital conversion cycle is terminated.

At step 214, it is determined whether the first analog sample is greater than the comparison voltage. If the first analog sample is greater than the comparison voltage, step 216 is performed, else step 218 is performed. At step 216, the comparison voltage is increased by a predetermined value. In an embodiment of the present invention, the predetermined value is equal to (reference voltage/2^N)*2^(bit index counter–1), where N is the resolution of the ADC. In the example above, for a bit index counter value of 4 and N=10, the predetermined value is (reference voltage*8/4096). At step 218, the comparison voltage is decreased by the predetermined value, i.e., by 8 volts in the example above. At step 220, the bit counter is reduced by 1. Thereafter, steps 212 through 220 are repeated for a count equal to the LSBs that alternate, instead of a count equal to the ADC resolution, to generate the digital output signal corresponding to the first analog sample.

Figure 3:
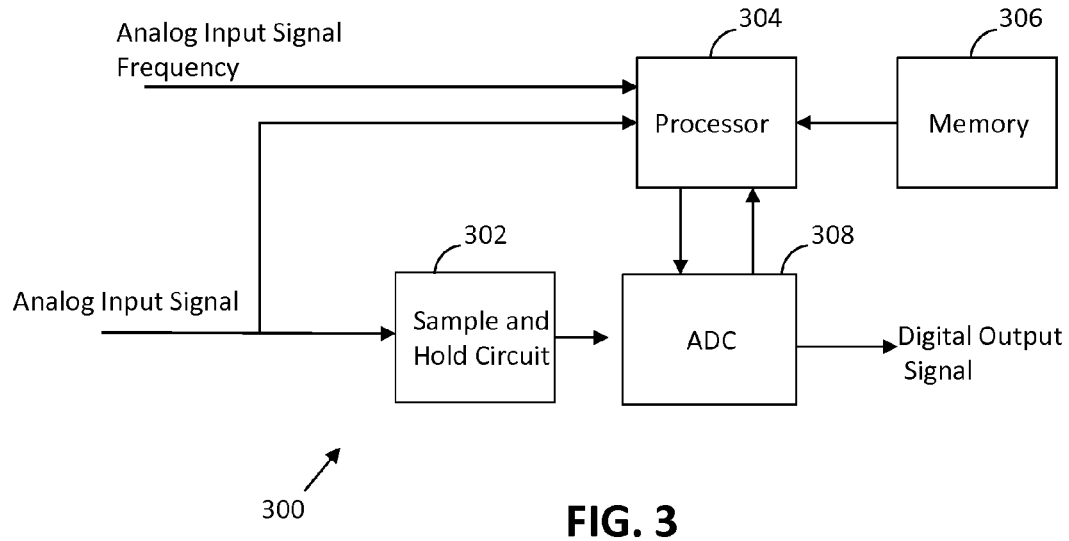
FIG. 3 is a schematic block diagram of a system for converting an analog signal to a digital signal in accordance with an embodiment of the present invention.

Referring now to FIG. 3, a schematic diagram illustrating a system 300 for converting an analog input signal to a digital output signal in accordance with an embodiment of the present invention is shown. The system 300 includes a sample-and-hold (S/H) circuit 302, a processor 304, a memory 306, and an analog-to-digital converter (ADC) 308.

The analog input signal is provided to the S/H circuit 302 and the processor 304. The S/H circuit 302 samples the analog input signal in a sampling cycle to obtain a first analog sample, and transmits the first analog sample to the ADC 308 for conversion to the digital output signal. The processor 304 determines a count of LSBs of the digital output signal that alternate between the first and a second analog sample, based on a maximum frequency of the analog input signal and a predetermined bit-length of the digital output signal. The second analog sample is obtained during a previous (or next) sampling cycle and a frequency band (bandwidth) provided by a user. In an embodiment of the present invention, the first and second analog samples are obtained in consecutive sampling cycles.

The processor 304 determines the count of LSBs using the mathematical relationship given by equation (1) as described in conjunction with FIG. 1. Alternatively, the count of LSBs of the digital output signal that alternate between the first and second analog samples is obtained from a look-up table stored in the memory 306. In an embodiment of the present invention, the look-up table includes a plurality of signal bandwidths of the analog input signal and the corresponding predicted count of LSBs that will alternate. The processor 304 also determines whether an analog-to-digital conversion cycle is a first conversion cycle. For a first conversion cycle, the processor 304 instructs the ADC 308 to execute a successive approximation algorithm for a count equal to the ADC resolution. However, if the conversion cycle is not the first conversion cycle, the processor 304 instructs the ADC 308 to execute the successive approximation algorithm for a count equal to the count of the LSBs that alternate to generate the digital output signal corresponding to the first analog sample. Thus, the successive approximation algorithm is executed for the count equal to the count of the LSBs that alternate, instead of the count equal to the ADC resolution.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A system for converting an analog input signal to a digital output signal in one or more analog-to-digital conversion cycles, comprising:
    a sample-and-hold circuit for sampling the analog input signal to obtain a first analog sample in a sampling cycle;
    a processor for determining a count of least significant bits of the digital output signal that alternate between the first analog sample and a second analog sample of the analog input signal based on a frequency of the analog input signal and a predetermined bit-length of the digital output signal; and
    an analog-to-digital converter (ADC), connected to the sample and hold circuit and the processor, for converting the first analog sample to the digital output signal using a successive approximation algorithm, wherein the ADC executes the successive approximation algorithm for a count equal to the count of the least significant bits that alternate between the first and second analog samples.

2. The system of claim 1, wherein the second analog sample is sampled in a previous sampling cycle.

3. The system of claim 1, further comprising:
    a memory, connected to the processor, for storing a look-up table comprising a mapping of a plurality of signal bandwidths of the analog input signal and the corresponding count of least significant bits that alternate between the first and second analog samples of the analog input signal.

4. The system of claim 1, wherein the processor further determines a first analog-to-digital conversion cycle.

5. The system of claim 4, wherein the ADC further executes the successive approximation algorithm for a count equal to the predetermined bit-length of the digital output signal in the first analog-to-digital conversion cycle.

6. The system of claim 4, wherein a bandwidth of the analog input signal is less than half of a sampling frequency.

7. The system of claim 4, wherein a frequency band of the analog input signal is provided by a user.

8. A method for converting an analog input signal to a digital output signal in one or more analog-to-digital conversion cycles, comprising:
    sampling the analog input signal to obtain a first analog sample in a sampling cycle;
    determining a count of least significant bits of the digital output signal that alter between the first analog sample and a second analog sample of the analog input signal based on a frequency of the analog input signal and a predetermined bit-length of the digital output signal, wherein the second analog sample is sampled in a previous sampling cycle; and
    converting the first analog sample to the digital output signal using a successive approximation algorithm, wherein the successive approximation algorithm is executed for a count equal to the count of the least significant bits that alter between the first and second analog samples.

9. The method of claim 8, wherein converting the first analog sample to the digital output signal further comprises:
    comparing a magnitude of the first analog sample with a magnitude of a comparison voltage;
    modifying the magnitude of the comparison voltage based on the magnitude of the first analog sample, wherein modifying the comparison voltage comprises at least one of an increasing and decreasing the magnitude of the comparison voltage by a predetermined value; and
    generating the digital output signal corresponding to the first analog sample.

10. The method of claim 8, wherein the successive approximation algorithm is executed for a count equal to the predetermined bit-length of the digital output signal in a first analog-to-digital conversion cycle.

11. The method of claim 8, wherein a frequency band of the analog input signal is input by a user.

12. A method for converting an analog input signal to a digital output signal in one or more analog-to-digital conversion cycles, comprising:
    sampling the analog input signal to obtain a first analog sample in a sampling cycle;
    determining a count of least significant bits of the digital output signal that alter between the first analog sample and a second analog sample of the analog input signal based on a frequency of the analog input signal and a predetermined bit-length of the digital output signal, wherein the second analog sample is sampled in a previous sampling cycle; and
    comparing a magnitude of the first analog sample with a magnitude of a comparison voltage;
    modifying the magnitude of the comparison voltage based on the magnitude of the first analog sample, wherein modifying the comparison voltage comprises at least one of an increasing and decreasing the magnitude of the comparison voltage by a predetermined value; and
    generating the digital output signal corresponding to the first analog sample by executing a successive approximation algorithm for a count equal to the count of the least significant bits that alter between the first and second analog samples.

13. The method of claim 12, wherein the successive approximation algorithm is executed for a count equal to the predetermined bit-length of the digital output signal in a first analog-to-digital conversion cycle.

14. The method of claim 12, wherein a frequency band of the analog input signal is input by a user.

* * * * *